United States Patent
Goto et al.

(10) Patent No.: US 8,509,024 B2
(45) Date of Patent: Aug. 13, 2013

(54) SEMICONDUCTOR DEVICE HAVING PLURAL INTERNAL VOLTAGE GENERATING CIRCUITS AND METHOD OF CONTROLLING THE SAME

(75) Inventors: Kosuke Goto, Tokyo (JP); Takuyo Kodama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 65 days.

(21) Appl. No.: 13/305,691

(22) Filed: Nov. 28, 2011

(65) Prior Publication Data

US 2012/0140578 A1   Jun. 7, 2012

(30) Foreign Application Priority Data

Dec. 7, 2010 (JP) ................................ 2010-272387

(51) Int. Cl.
*G11C 5/14* (2006.01)

(52) U.S. Cl.
USPC ................. 365/226; 365/189.07; 365/189.08; 327/535; 327/536

(58) Field of Classification Search
USPC ............ 365/189.05, 189.07, 189.08, 189.09, 365/226; 327/3, 12, 99, 535, 536, 537
See application file for complete search history.

(56) References Cited

U.S. PATENT DOCUMENTS

| 5,959,854 | A | 9/1999 | Okada | |
|---|---|---|---|---|
| 5,982,222 | A | 11/1999 | Kyung | |
| 2007/0024349 | A1* | 2/2007 | Tsukude | 327/540 |
| 2008/0111533 | A1* | 5/2008 | Kang | 323/318 |
| 2012/0112821 | A1* | 5/2012 | Yoshida | 327/540 |

FOREIGN PATENT DOCUMENTS

| JP | 9-320268 A | 12/1997 |
|---|---|---|
| JP | 11-025673 A | 1/1999 |

* cited by examiner

*Primary Examiner* — Alexander Sofocleous
*Assistant Examiner* — Hien Nguyen
(74) *Attorney, Agent, or Firm* — McGinn IP Law Group, PLLC

(57) ABSTRACT

Such a device is disclosed that includes a terminal, a first voltage generator generating, when activated, a voltage at the terminal and stopping, when deactivated, generating the voltage, and a second voltage generator generating, when activated, the voltage at the terminal and stopping, when deactivated, generating the voltage. The first voltage generator being configured to be activated in response to a first control signal taking an active level and deactivated in response to the first control signal taking an inactive level, and the second voltage generator being configured to be activated in response to each of the first control signal and a second control signal taking an active level and deactivated in response to at least one of the first and second control signal taking an inactive level.

20 Claims, 10 Drawing Sheets

SEMICONDUCTOR DEVICE HAVING PLURAL INTERNAL VOLTAGE GENERATING CIRCUITS AND METHOD OF CONTROLLING THE SAME

BACKGROUND OF THE INVENTION

1. Field of the Invention

The present invention relates to a semiconductor device and a method of controlling the same, and more particularly to a semiconductor device including internal voltage generating circuits that generate an internal voltage and a method of controlling the same.

2. Description of Related Art

Semiconductor devices such as a DRAM (dynamic random access memory) may include a circuit block that operates on an internal voltage different from an external voltage supplied from outside. Such a semiconductor device includes an internal voltage generating circuit that generates the internal voltage based on the external voltage supplied to the semiconductor device. The internal voltage generating circuit supplies the internal voltage to load circuits in the semiconductor device (see Japanese Patent Application Laid-Open Nos. H9-320268 and H11-25673).

In Japanese Patent Application Laid-Open No. H9-320268, a semiconductor device includes a plurality of internal voltage generating circuits connected to a power supply line in parallel. The internal voltage generating circuits start operation in response to a drop in the internal voltage. The operation timing is thus asynchronous to an operation timing of other circuit blocks. Consequently, the other circuit blocks may be affected by asynchronous noise caused by the operation of the internal voltage generation circuits. To solve such a problem, Japanese Patent Application Laid-Open No. H11-25673 describes a semiconductor device including internal voltage generating circuits to produce less noise.

Studies made by the inventors have shown, however, that noise occurring from an internal voltage generating circuit can affect not only circuit blocks (first load circuits) using the internal voltage, but also circuit blocks (second load circuits) using a voltage different from the internal voltage. The noise occurring from an internal voltage generating circuit may propagate toward the second load circuits through various channels such as the semiconductor substrate itself, a ground line supplying a ground potential, and a first power supply line supplying a power source to the internal voltage generating circuit or the second load circuits. It is therefore considered to be desirable that internal voltage generating circuits be controlled in consideration of the operation timing of circuit blocks using voltage other than the internal voltage.

SUMMARY

In one embodiment, there is provided a semiconductor device that includes: first and second power supply lines; a plurality of internal voltage generating circuits each supplying a first voltage to the first power supply line; a comparison circuit comparing the first voltage with a reference voltage to generate a comparison signal, the comparison signal indicating a first logic level when the first voltage is lower than the reference voltage and indicating a second logic level when the first voltage is higher than the reference voltage; a first load circuit operating on the first voltage; a second load circuit operating on a second voltage supplied from the second power supply line; and a control circuit generating a control signal, the control signal indicating a third logic level when the second load circuit is in an active state and indicating a fourth logic level when the second load circuit is in an inactive state. The internal voltage generating circuits may include at least first and second internal voltage generating circuits in which the first internal voltage generating circuit is activated when the comparison signal indicates the first logic level and the control signal indicates the fourth logic level, and deactivated when the comparison signal indicates the first logic level and the control signal indicates the third logic level or when the comparison signal indicates the second logic level, and the second internal voltage generating circuit is activated regardless of a logic level of the control signal when the comparison signal indicates the first logic level, and deactivated when the comparison signal indicates the second logic level.

In another embodiment, a device includes a terminal, a first voltage generator generating, when activated, a voltage at the terminal and stopping, when deactivated, generating the voltage, the first voltage generator being configured to be activated in response to a first control signal taking an active level and deactivated in response to the first control signal taking an inactive level, and a second voltage generator generating, when activated, the voltage at the terminal and stopping, when deactivated, generating the voltage, the second voltage generator being configured to be activated in response to each of the first control signal and a second control signal taking an active level and deactivated in response to at least one of the first and second control signal taking an inactive level.

DETAILED DESCRIPTION OF THE EMBODIMENT

Figure 1:
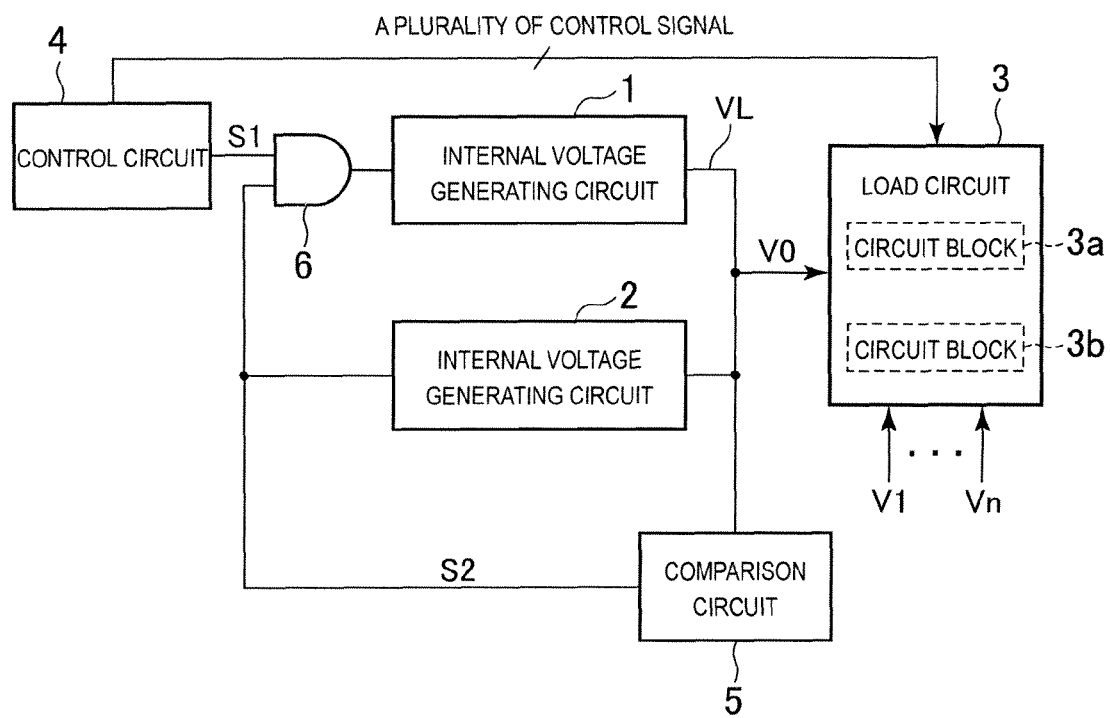
FIG. 1 is a schematic diagram for explaining an embodiment of the present invention.

Referring now to FIG. 1, a semiconductor device according to the embodiment of the present invention includes internal voltage generating circuits 1 and 2, a load circuit 3, a control circuit 4, and a comparison circuit 5. The internal voltage generating circuits 1 and 2 are connected in parallel to a power supply line VL. The load circuit 3 includes a circuit block 3a that operates on an internal voltage V0 supplied from the power supply line VL, and various types of circuit block 3b that operate on other voltages V1 to Vn. The control circuit 4 controls the load circuit 3 and the internal voltage generating circuits 1 and 2. The comparison circuit 5 compares the internal voltage V0 with a reference voltage (Vref) not shown in FIG. 1. The other voltages V1 to Vn may include, for example, an external voltage VDD supplied from outside of the semiconductor device, step-down voltages VPERI and VARY output from step-down circuits (not shown) for generating step-down potentials from the external voltage VDD, and a negative voltage VNEG output from a negative voltage generating circuit (not shown) for generating a potential lower than a ground potential. The ground potential (VSS) is omitted here. The load circuit 3 includes various types of circuit blocks 3a and 3b operating on such voltages V0 to Vn. Some of the circuit blocks in the load circuit 3 are sensitive and susceptible to noise. The control circuit 4 controls the load circuit 3 including some of the sensitive circuit blocks by using a plurality of control signals. The control circuit 4 activates a detection signal S1 in a period where to operate some of the sensitive circuit blocks.

The power supply line VL is also connected with the comparison circuit 5. The comparison circuit 5 determines whether or not the internal voltage V0 on the power supply line VL is higher than a desired level. If the internal voltage V0 on the power supply line VL is lower than the desired level, the comparison circuit 5 activates a detection signal S2. The detection signal S2 is supplied to the internal voltage generating circuit 2. The detection signal S2 is also supplied to the internal voltage generating circuit 1 through an AND gate circuit 6. The detection signal S1 output from the control circuit 4 is also supplied to the AND gate circuit 6.

With such a configuration, the internal voltage generating circuit 1 makes an operation to generate the internal voltage V0 when both the detection signals S1 and S2 are activated. The internal voltage generating circuit 2 makes an operation to generate the internal voltage V0 when the detection signal S2 is activated, regardless of the detection signal S1. Consequently, even when the internal voltage V0 on the power supply line VL falls below the desired level, the control circuit 4 disables the internal voltage generating circuit 1 if some of the sensitive circuit blocks are in operation. This can prevent an increase of noise due to parallel operation of a number of internal voltage generating circuits. Even if the internal voltage generating circuit 1 is disabled, the internal voltage V0 on the power supply line VL is supplied by the internal voltage generating circuit 2. It is therefore possible to raise the internal voltage V0 to a desired level.

Figure 2:
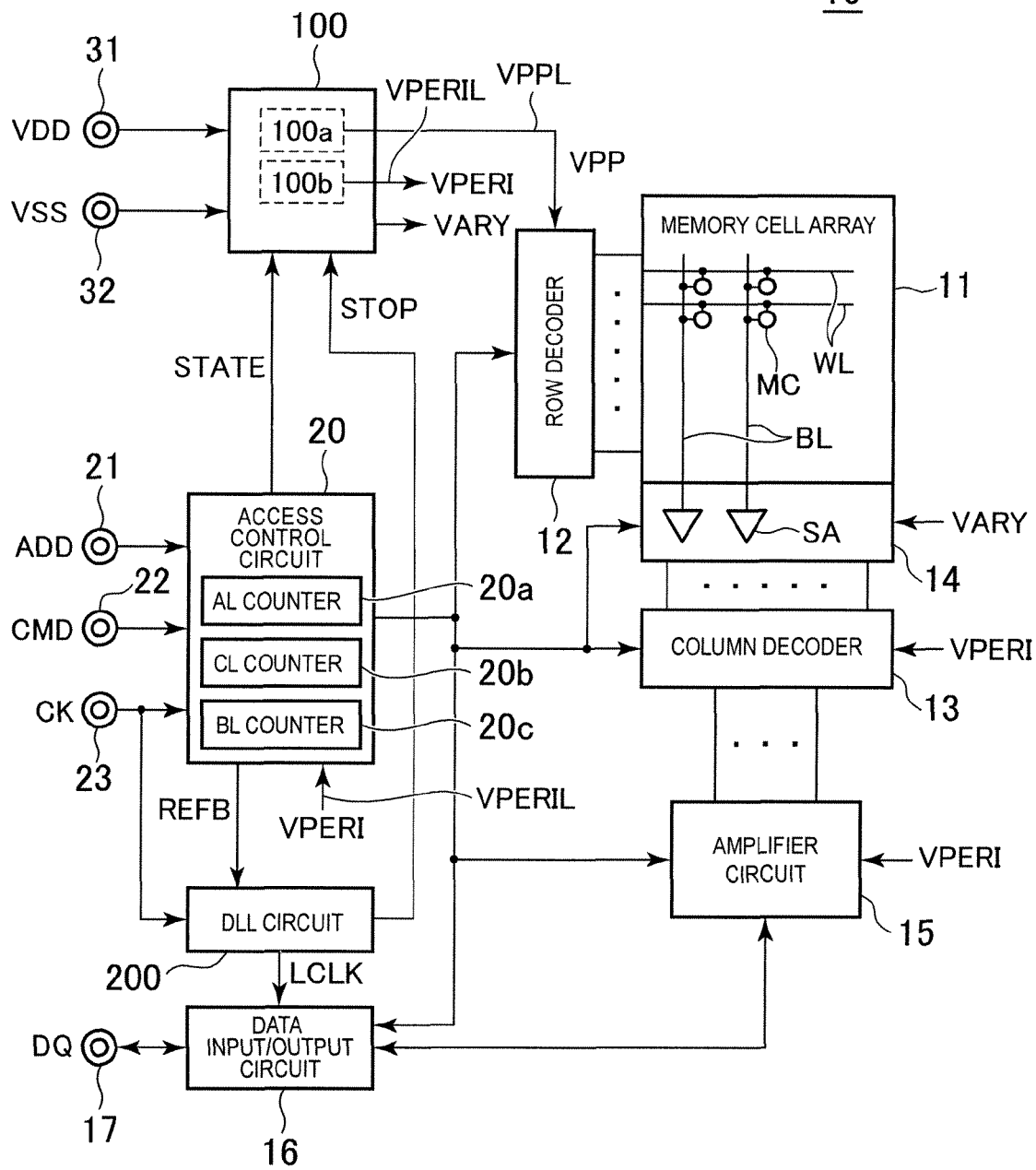
FIG. 2 is a block diagram indicative of a configuration of a semiconductor device 10 according to an embodiment of the present invention.

Turning to FIG. 2, the semiconductor device 10 according to the present embodiment is a DRAM, and includes a memory cell array 11. The memory cell array 11 includes a plurality of word lines WL and a plurality of bit lines BL intersecting each other. A plurality of memory cells MC are arranged at the intersections of a plurality of word lines WL and a plurality of bit lines BL, respectively. The word lines WL are selected by a row decoder 12. The bit lines BL are selected by a column decoder 13. The bit lines BL are connected to respective corresponding sense amplifiers SA in a sense circuit 14. Bit lines BL selected by the column decoder 13 are connected to an amplifier circuit 15 through sense amplifiers SA. The amplifier circuit 15 is connected to a data input/output circuit 16 which is a port intended for data communications with outside. The row decoder 12 corresponds to the circuit block 3a (shown in FIG. 1). The column decoder 13, the sense amplifiers SA, the amplifier circuit 15, the access control circuit 20, a DLL circuit 200, and the data input/output circuit 16 are the circuit blocks 3b (shown in FIG. 1).

The operations of the row decoder 12 and the column decoder 13 are controlled by an access control circuit 20. The access control circuit 20 is supplied with an address signal ADD, a command signal CMD, and a clock signal CK from outside through an address terminal 21, a command terminal 22, and a clock terminal 23, respectively. Based on the signals ADD, CMD, and CK, the access control circuit 20 controls the row decoder 12, the column decoder 13, the sense amplifiers SA, the amplifier circuit 15, and the data input/output circuit 16 in operation. As employed herein, a circuit block that includes the amplifier circuit 15 and the data input/output circuit 16 may be referred to as a "data output circuit." In a modification of the embodiment to be described later, the "data output circuit" also includes the sense amplifiers SA.

Specifically, when the command signal CMD indicates an active operation (active command), the address signal ADD is supplied to the row decoder 12. In response, the row decoder 12 selects the word line WL specified by the address signal ADD, whereby corresponding memory cells MC are connected to the respective bit lines BL. When the command signal CMD indicates an active operation (active command), the sense amplifiers SA amplify the voltages of the bit lines EL, thereby amplifying information on the corresponding memory cells MC. When an active command is followed by a command signal CMD indicating a read operation (read command) or write operation (write command), the address signal ADD is supplied to the column decoder 13. In response, the column decoder 13 connects the bit lines BL specified by the address signal ADD to the amplifier circuit 15. If the command signal CMD indicates a read operation, read data DQ read from the memory cell array 11 through sense amplifiers SA is thus output to the data input/output circuit 16 through the amplifier circuit 15. On the other hand, if the command signal CMD indicates a write operation, write data DQ supplied through the data input/output circuit 16 is written into the memory cells MC through the amplifier circuit 15 and sense amplifiers SA. If the command signal CMD indicates a refresh operation (refresh command), a refresh address not shown is supplied to the row decoder 12 instead of the address signal ADD. In response, the row decoder 12 selects the word lines WL specified by the refresh address, whereby corresponding memory cells MC are connected to the respective bit lines BL. The sense amplifiers SA amplify the voltages of the bit lines BL, thereby amplifying information on the corresponding memory cells MC. The refresh command will not operate the column decoder 13. That is, an active command and a read command or write command constitute a set command. A refresh command is a single command without an accompanying read command or write command.

The data input/output circuit 16 is a circuit for outputting read data DQ and inputting write data DQ through a data input/output terminal 17. The data input/output circuit 16 outputs read data DQ in synchronization with a clock signal LCLK. The clock signal LCLK is generated by the DLL circuit 200 to be phase-controlled with respect to the clock signal CK supplied from outside.

Each of the foregoing circuit blocks operates on a predetermined internal voltage as its power supply. The internal voltages are generated by a power supply circuit 100 shown in FIG. 2. The power supply circuit 100 generates internal voltages VPP, VPERI, VARY, and so on based on an external potential VDD and a ground potential VSS supplied from outside of the semiconductor device 10 through power supply terminals 31 and 32, respectively. As employed herein, VDD, VPP, VPERI, and VARY refer not only to the levels of the respective potentials but also to potential differences (voltages) from the ground potential VSS. For example, "VDD" refers to the potential level itself of the external potential VDD, as well as the potential difference (voltage) from the ground potential VSS. The same holds for VPP, VPERI, and VARY. In the present embodiment, $$VPP > VDD > VPERI \approx VARY.$$

The power supply circuit 100 includes a boosting circuit 100a and a step-down circuit 100b. The boosting circuit 100a boosts the external voltage VDD to generate the internal voltage VPP. The step-down circuit 100b steps down the external voltage VDD to generate the internal voltage VPERI. The power supply circuit 100 includes another step-down circuit (not shown) which steps down the external voltage VDD to generate the internal voltage VARY. The voltages VPP, VPERI, and VARY maintain their respective predetermined voltages irrespective of potential variations in VDD.

The internal voltage VPP is used at least in the row decoder 12. The row decoder 12 thus constitutes a load circuit of the boosting circuit 100a. The internal voltage VPP is also supplied to other circuits (not shown). Such other circuits also constitute load circuits of the boosting circuit 100a. The row decoder 12 drives the word line WL selected based on the address signal ADD to the VPP level, thereby turning ON (making electrically conducting) the cell transistors included in the memory cells MC. The internal voltage VARY is used in the sense circuit 14. The sense circuit 14, when activated, drives either one of each pair of bit lines to the VARY level and the other to the VSS level, thereby amplifying read data read out from memory cells MC. The internal voltage VPERI is supplied to most of the peripheral circuits such as the access control circuit 20 through corresponding power supply lines VPERIL. The internal voltage VPERI is the operating voltage of such peripheral circuits. Using the internal voltage VPERI lower than VDD as the operating voltage of the peripheral circuits reduces the power consumption of the peripheral circuits. The same holds for the circuits supplied with VARY. Whether VPERI=VARY or VPERI≈VARY is appropriately determined depending on the intended targets of the respective corresponding plurality of circuits.

Figure 3:
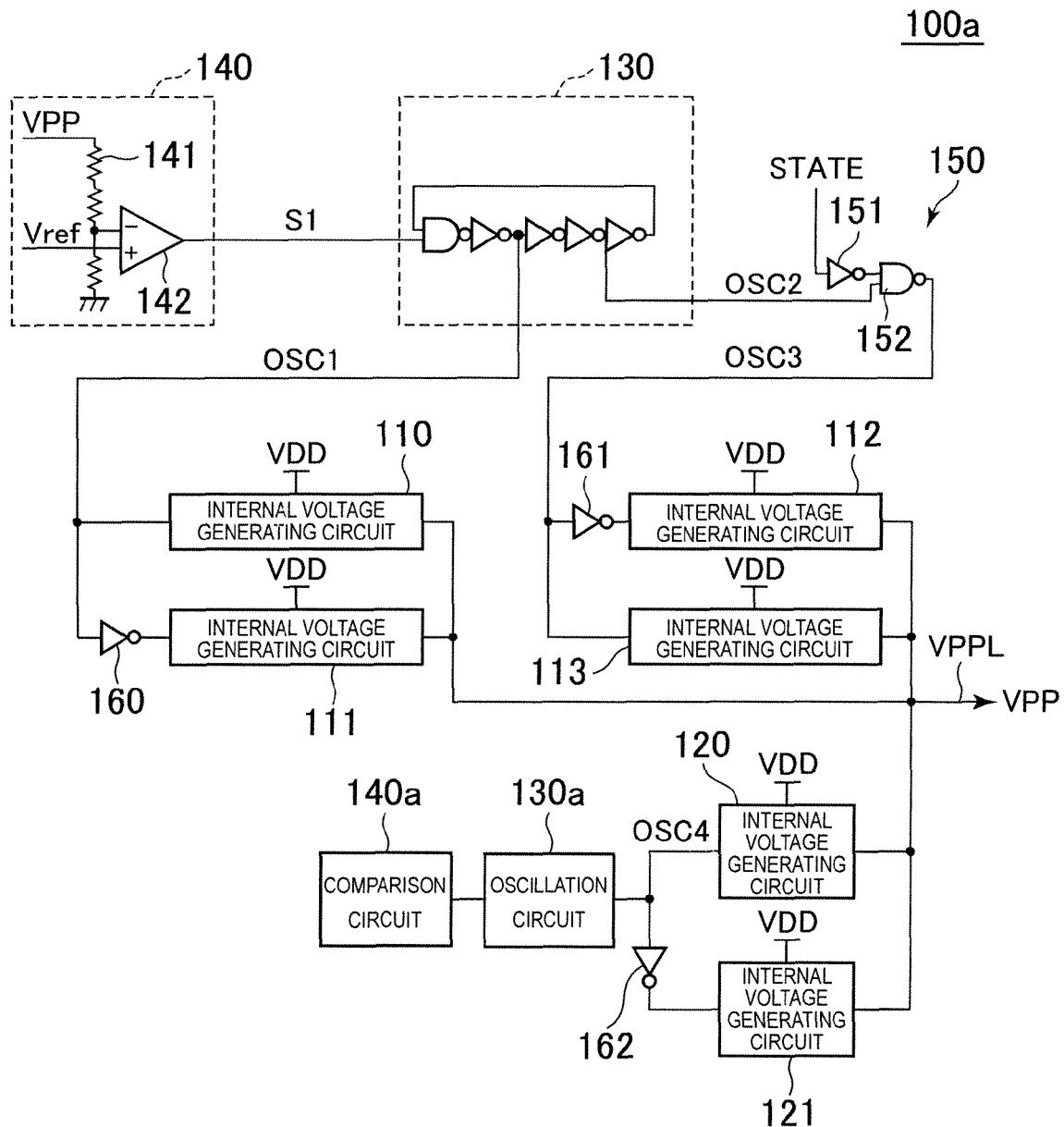
FIG. 3 is a block diagram indicative of a boosting circuit 100a for generating an internal voltage VPP among circuit blocks in a power supply circuit 100 shown in FIG. 2.

Turning to FIG. 3, the boosting circuit 100a in the power supply circuit 100 includes six internal voltage generating circuits 110 to 113, 120, and 121, which generate the internal voltage VPP from the external voltage VDD to supply the internal voltage VPP to a power supply line VPPL. Of these, the internal voltage generating circuits 110 to 113 have a current supplying capability relatively higher than that of the internal voltage generating circuits 120 and 121. The internal voltage generating circuits 110 to 113 are activated when the semiconductor device 10 is in an active state, and deactivated when the semiconductor device 10 is in a standby state. On the other hand, the internal voltage generating circuits 120 and 121 have a current supplying capability relatively lower than that of the internal voltage generating circuits 110 to 113. The internal voltage generating circuits 120 and 121 continue being activated in a standby state supplied with the external voltage VDD, regardless of whether or not the semiconductor device 10 is in an active state. The internal voltage generating circuits 120 and 121 are therefore designed to a minimum capability (minimum current supplying capability) so that the voltage VPP of the power supply line VPPL can be maintained to a desired value when the semiconductor device 10 is in a standby state.

The internal voltage generating circuits 110 to 113 are designed so that the voltage VPP can be maintained to a desired value or a dropped voltage VPP can be restored to a desired level within a predetermined time (recovery time) even when the semiconductor device 10 is in an active state and the load (current consumption) on the power supply line VPPL reaches its maximum. For example, the load on the power supply line VPPL peaks when a plurality of refresh commands (refresh operations) are successively issued in a time series. When a refresh command is issued, word lines more than the number of word lines to be activated in an active operation (active command) are activated in a short time. This maximizes the load (current consumption) on the power supply line VPPL supplying the internal voltage VPP. For example, assuming that N is the number of word lines that the row decoder 12 activates for a single active command, the number of word lines that the row decoder 12 activates for a single refresh command is 2N or 3N. That is, the current consumption of the row decoder 12 (load circuit) (=the load (current consumption) on the power supply line VPPL) for a single refresh command is higher than that for a single active command. This means that the internal voltage generating circuits 110 to 113 have a sufficient margin in the current supplying capability at least unless a refresh command is supplied or refresh commands are supplied in succession. To put another way, in an active state corresponding to an active command, it is possible to restore the voltage on the power supply line VPPL to a desired level (reference voltage Vref) within a predetermined time (recovery time) by using only two internal voltage generating circuits 110 and 111. When a refresh command is supplied or refresh commands are supplied in succession, it is not possible to restore the voltage with only the internal voltage generating circuits 110 and 111 within the predetermined time. The internal voltage generating circuits 110 to 113 can be used to restore the voltage to the desired level within the predetermined time.

The internal voltage generating circuits 110 to 113 operate in synchronization with periodic oscillator signals OSC1 and OSC2 supplied from an oscillation circuit 130. The oscillation circuit 130 includes an odd number of stages of inverters cyclically connected. The oscillation circuit 130 performs an oscillation operation to output the oscillator signals OSC1 and OSC2 when the detection signal S1 supplied from the comparison circuit 140 is activated to a high level. When the detection signal S1 is deactivated to a low level, the oscillation circuit 130 stops the oscillation operation.

The oscillator signal OSC1 is simply supplied to the internal voltage generating circuit 110. The oscillator signal OSC1 is also inverted by an inverter 160 into an oscillator signal OSC1B different from the oscillator signal OSC1 in phase by 180°. The oscillator signal OSC1B is supplied to the internal voltage generating circuit 111. Meanwhile, the oscillator signal OSC2 is converted into an oscillator signal OSC3 through a control circuit 150. The oscillator signal OSC3 is simply supplied to the internal voltage generating circuit 113. The oscillator signal OSC3 is also inverted by an inverter 161 into an oscillator signal OSC3B different from the oscillator signal OSC3 in phase by oscillator signal OSC3. The oscillator signal OSC3B is supplied to the internal voltage generating circuit 112. The oscillator signals OSC1 and OSC2 are taken out from respective different taps of the oscillation circuit 130. The oscillator signals OSC1 and OSC2 are different from each other in phase by 90°. The internal voltage generating circuits 110 and 111 constitute a first group, and the internal voltage generating circuits 112 and 113 a second group. It is suited to noise distribution that the first group of internal voltage generating circuits 110 and 111 have a phase difference of 180° from each other when the second group of internal voltage generating circuits 112 and 113 are stopped.

The comparison circuit 140 determines whether or not the internal voltage VPP on the power supply line VPPL is higher than or equal to a desired level. The comparison circuit 140 includes a resistance circuit 141 dividing the internal voltage VPP, and a comparator 142 comparing the output voltage of the resistance circuit 141 with the reference voltage Vref. The reference voltage Vref is set to the same level as that of the output voltage obtained from the resistance circuit 141 when the internal voltage VPP is at the desired level. If the internal voltage VPP on the power supply line VPPL is lower than the desired level, the detection signal S1 is activated to a high level to activate the oscillation circuit 130.

The control circuit 150 includes a logic gate circuit supplied with the oscillator signal OSC2 and a read state signal STATE. The read state signal STATE is associated with a read operation (read command), supplied from the access control circuit 20 shown in FIG. 2. The read state signal STATE is activated to a high level at least in a period where the data output circuit (the amplifier circuit 15 and the data input/output circuit 16) is in operation. The control circuit 150 includes an inverter 151 and a NAND gate circuit 152. Activating the read state signal STATE to a high level fixes the output signal of the NAND gate circuit 152 to a high level through the inverter 151. This prevents the periodic oscillator signal OSC3 from being supplied to the internal voltage generating circuits 112 and 113 even if the periodic oscillator signal OSC2 is supplied. In the meantime, the oscillator signal OSC1 continues being supplied to the internal voltage generating circuits 110 and 111 regardless of the read state signal STATE. It will be understood that the read state signal STATE may be associated not only with a read operation (read command) but also with an active operation (active command) in a modification of the embodiment. The reason is that an active operation (active command), as mentioned previously, will not maximize the load (current consumption) on the power supply line VPPL.

An oscillation circuit 130a and a comparison circuit 140a provided for the internal voltage generating circuits 120 and 121 have basically the same circuit configurations as those of the oscillation circuit 130 and the comparison circuit 140 described above. When the internal voltage VPP on the power supply line VPPL is lower than a desired level, the oscillation circuit 130a generates a periodic oscillator signal OSC4. The oscillator signal OSC4 is simply supplied to the internal voltage generating circuit 120. The oscillator signal OSC4 is also inverted by an inverter 162 into an oscillator signal OSC4B, which is supplied to the internal voltage generating circuit 121. The internal voltage generating circuits 120 and 121 therefore operate in phases different from each other by 180°.

Figure 4:
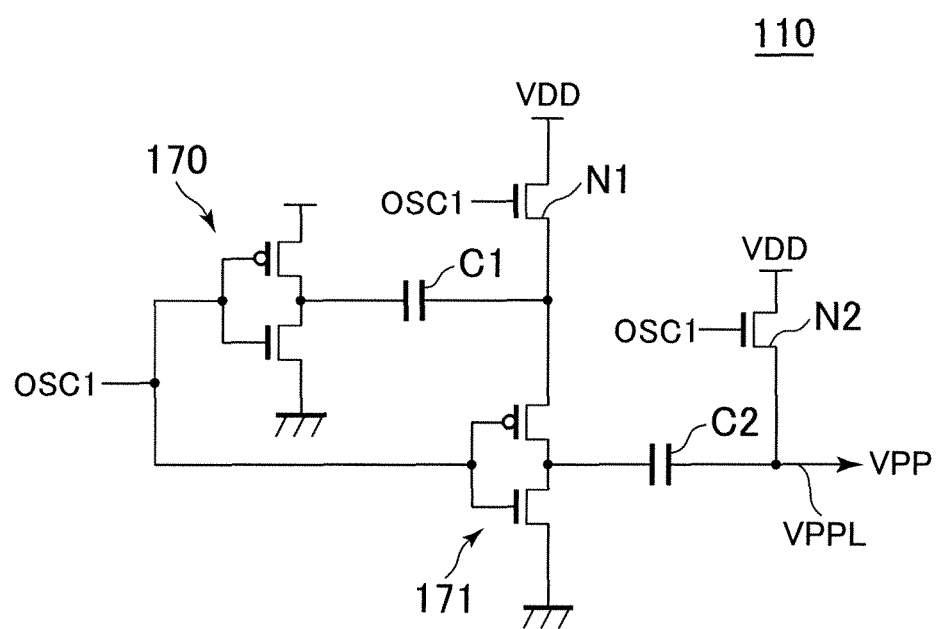
FIG. 4 is a circuit diagram of an internal voltage generating circuit 110 shown in FIG. 3.

Turning to FIG. 4, the internal voltage generating circuit 110 is a so-called booster pump circuit, and includes inverters 170 and 171, capacitors C1 and C2, and transistors N1 and N2. The oscillator signal OSC1 is input to the inverters 170 and 171. The capacitor C1 is connected between the output node of the inverter 170 and the high-level power supply node of the inverter 171. The external voltage VDD is supplied to the high-level power supply node of the inverter 171 through the transistor N1. The capacitor C2 is connected between the output node of the inverter 171 and the output node of the internal voltage generating circuit 110, i.e., the power supply line VPPL. The external voltage VDD is supplied to the power supply line VPPL through the transistor N2.

With such a configuration, in a period where the oscillator signal OSC1 is at a high level, the output signals of the inverters 170 and 171 are at a low level and the transistors N1 and N2 are ON. The capacitors C1 and C2 are thereby charged with VDD. When the oscillator signal OSC1 changes to a low level, the output signals of the inverters 170 and 171 change to a high level. This pumps the charges out of the capacitors C1 and C2, and the boosted voltage is supplied to the power supply line VPPL. The foregoing operation is repeated in synchronization with the oscillator signal OSC1 to raise the voltage on the power supply line VPPL.

The other internal voltage generating circuits 111 to 113, 120, and 121 have the same circuit configuration as that of the internal voltage generating circuit 110 shown in FIG. 4 except in that the respective corresponding oscillator signals are supplied instead of the oscillator signal OSC1.

Figure 5:
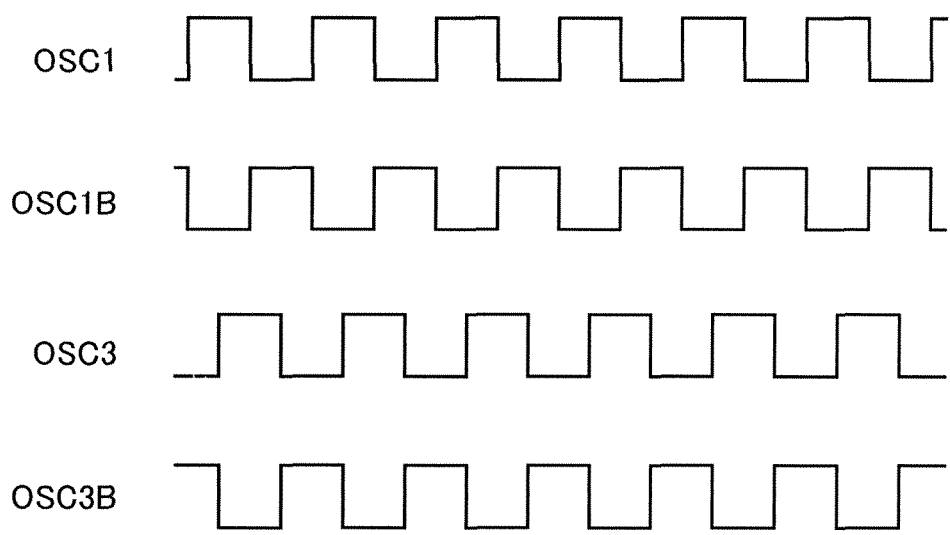
FIG. 5 is a waveform chart of oscillator signals.

Turning to FIG. 5, the oscillator signals OSC1 and OSC1B are different from each other in phase by 180°. The oscillator signals OSC3 and OSC3B are 180° different in phase. The oscillator signals OSC1 and OSC3 are different from each other in phase by 90°. Consequently, the oscillator signals OSC1, OSC1B, OSC3, and OSC3B are different from each other in phase by 90°. Since the oscillator signals OSC1, OSC1B, OSC3B, and OSC3 are supplied to the internal voltage generating circuits 110 to 113, respectively, the internal voltage generating circuits 110 to 113 perform a pumping operation at phases different from each other by 90°. Such phase-shifted operations of the internal voltage generating circuits 110 to 113 reduce noise occurring from the pumping operations.

Figure 6:
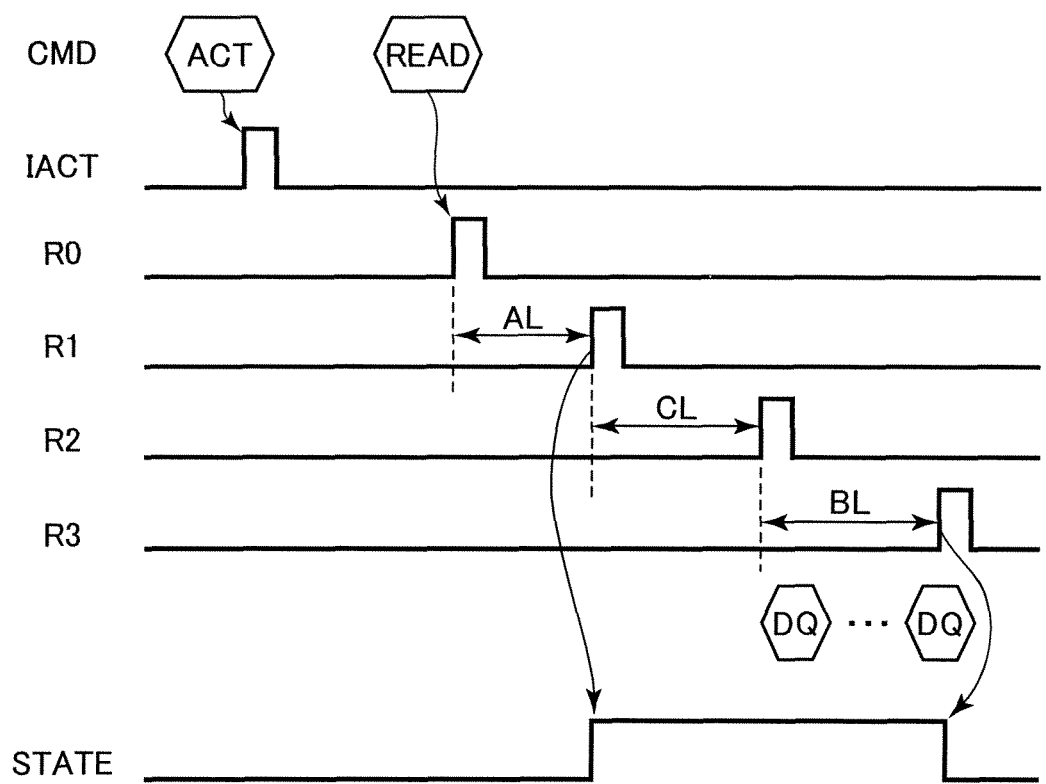
FIG. 6 is a timing chart for explaining a timing of occurrence of a read state signal STATE.

As shown in FIG. 6, an active command ACT is initially issued from outside. The access control circuit 20 shown in FIG. 2 activates an active signal IACT. The active signal IACT is a signal for activating the row decoder 12. When the active signal IACT is activated, the load (current consumption) on the power supply line VPPL therefore becomes higher until the word line WL rises.

Next, when a read command READ is issued from outside, the access control circuit 20 shown in FIG. 2 generates a read signal R0. The read signal R0 is an internal signal in the access control circuit 20 and will not be supplied to the column decoder 13 shown in FIG. 2 or the like. The read signal R0 is delayed by an AL counter 20a included in the access control circuit 20 to be output as a read signal R1 after a lapse of additive latency. The additive latency indicates the timing of issuing a read command to be issued in advance of original timing for the controller (not shown) of the semiconductor device 10 to issue a read command READ after a lapse of predetermined latency from the active command ACT. The timing of activation of the read signal R1 coincides with the original timing of issuance of the read command READ. The read signal R1 is supplied to the column decoder 13. In synchronization with the read signal R1, the column decoder 13 selects sense amplifiers SA from among the plurality of sense amplifiers SA based on a column address. Data in the selected sense amplifiers SA is transferred to the amplifier circuit 15.

The read signal R1 is further delayed by a CL counter 20b included in the access control circuit 20 to be output as a read signal R2 after a lapse of CAS latency. The CAS latency is the time from the original timing for the controller to issue a read command to the output of first read data DQ. The read signal R2 is supplied to the data input/output circuit 16 shown in FIG. 2. In synchronization with the read signal R2, the data input/output circuit 16 shown in FIG. 2 starts outputting the read data DQ.

The read signal R2 is further delayed by a BL counter 20c included in the access control circuit 20 to be output as a read signal R3 after a lapse of a burst output time. The burst output time indicates the time from the start of output of the first read data DQ to the start of the output of last read data DQ.

The period from the activation of the read signal R1 to the activation of the read signal R3 on the foregoing time axis is a read period, during which the read state signal STATE is activated. In the read period, the circuit block including the amplifier circuit 15 and the data input/output circuit 16 shown in FIG. 2, constituting the "data output circuit,", is susceptible to noise. If the circuit block undergoes noise, the read data DQ output from the circuit block may drop in signal quality. For example, the sense amplifier 15 itself senses sensitive weak potentials. The data input/output circuit 16 transfers high speed data without skew or jitter based on the clock signal LCLK for output, which is output by the DLL circuit 200 shown in FIG. 2. It will be understood that it is also possible to reduce noise to the sense amplifiers SA if the read state signal STATE is associated with an active operation (active command) as has been discussed in the foregoing modification of the embodiment. As described previously, when the load (current consumption) on the power supply line VPPL can peak in a refresh operation (refresh command), the internal voltage generating circuits 110 to 113 operate. Then, the time from the selection of word lines WL to the operation of sense amplifiers SA in a refresh operation may be set to be longer than the time from the selection of a word line WL to the operation of sense amplifiers SA in an active state (active command). Such setting makes the potentials on the input nodes of the sense amplifiers SA in a refresh operation higher than those in an active operation. This can prevent malfunction even if the sense amplifiers SA undergo noise occurring from the operation of the internal voltage generating circuits 110 to 113 in a refresh operation.

In the present embodiment, the read state signal STATE is activated in such a read period, so that the control circuit 150 (shown in FIG. 3) interrupts the oscillator signal OSC2. As a result, even if the voltage on the power supply line VPPL falls below a desired level (reference voltage Vref) in a read operation (or active operation), only the two internal voltage generating circuits 110 and 111 among the internal voltage generating circuits 110 to 113 perform a pumping operation, with the remaining internal voltage generating circuits 112 and 113 disabled. This can suppress noise occurring from the boosting circuit 110a. Moreover, the load (current consumption) on the power supply line VPPL in a read period (or in an active operation) is lower than under a refresh command. Consequently, even if the two internal voltage generating circuits 112 and 113 are disabled, it is possible to restore the voltage on the power supply line VPPL to a desired level (reference voltage Vref) within a predetermine time by using only the two internal voltage generating circuits 110 and 111.

Next, a second embodiment of the present invention will be described.

Figure 7:
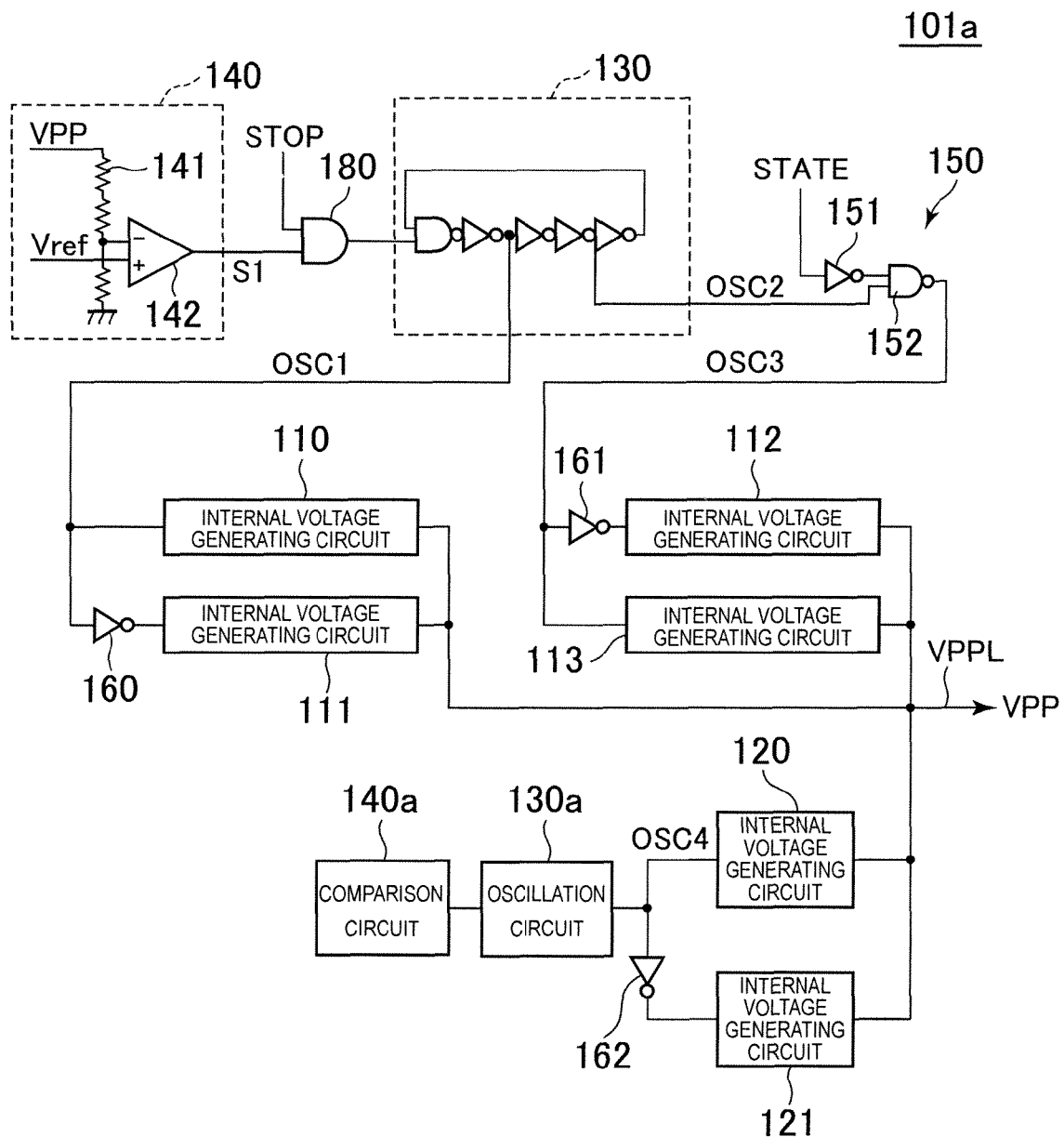
FIG. 7 is a block diagram of a boosting circuit 101a according to a second embodiment.

Turning to FIG. 7, the present embodiment differs from the first embodiment shown in FIG. 3 in a logic circuit 180 inserted into the signal path of the detection signal S1. In other respects, the present embodiment is the same as the first embodiment shown in FIG. 3. The same components will thus be designated by like reference numerals. Redundant description will be omitted.

The logic circuit 180 includes an AND gate circuit supplied with a stop signal STOP. In a period where the stop signal STOP is at a low level, the detection signal S1 is interrupted and then the operation of the oscillation circuit 130 is stopped. That is, even if the comparison circuit 140 detects that the internal voltage VPP on the power supply line VPPL is lower than a desired level, the operation of boosting the internal voltage VPP will not be performed. It should be noted that the internal voltage generating circuits 120 and 121 with low current supplying capability continue operating. The stop signal STOP rerates to the DLL circuit 200. The DLL circuit 200 to generate the stop signal STOP will be described below.

Figure 8:
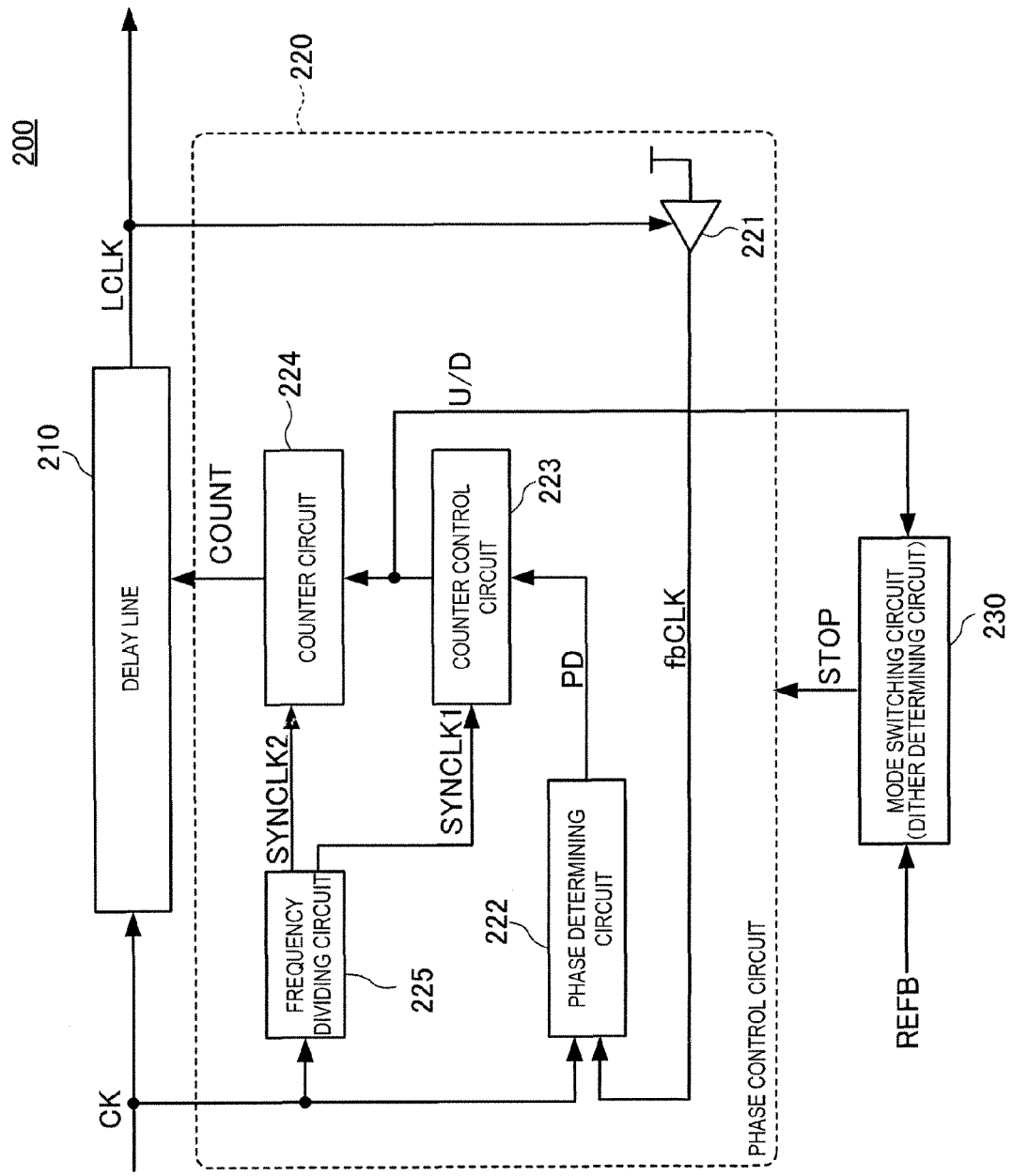
FIG. 8 is a block diagram indicative of a configuration of a DLL circuit 200 shown in FIG. 2.

Turning to FIG. 8, the DLL circuit 200 includes a delay line (delay circuit) 210, a phase control circuit 220, and a mode switching circuit 230.

The delay line 210 delays the clock signal CK (external synchronizing signal) supplied from outside of the semiconductor device 10 to generate the clock signal LCLK for output (internal synchronizing signal), and supplies the clock signal LCLK for output to the data input/output circuit 16 (shown in FIG. 2). The amount of delay of the delay line 210 is adjusted by the phase control circuit 220. It is preferred, though not limited in particular, that the delay line 210 includes a coarse delay line to delay the clock signal CK at relatively coarse adjustment pitches and a fine delay line to delay the clock signal CK at relatively fine adjustment pitches.

The phase control circuit 220 is a circuit block supplied with the clock signal CK and the clock signal LCLK for output, and adjusts the amount of delay of the delay line 210 based on these clock signals, thereby adjusting the phase of the clock signal LCLK for output. As shown in FIG. 8, the phase control circuit 220 includes a replica circuit 221, a phase determining circuit 222, a counter control circuit 223, a counter circuit 224, and a frequency dividing circuit 225.

The replica circuit 221 has substantially the same circuit configuration as that of an output buffer included in the data input/output circuit 16, and outputs a feedback clock signal fbCLK in synchronization with the clock signal LCLK for output. The phase of the feedback clock signal fbCLK is thereby exactly matched with that of read data DQ. It should be noted that the transistors constituting the replica circuit 221 need not have the same size as that of the transistors constituting the output buffer. Shrunk transistors may be used as long as the transistors have substantially the same impedances.

The feedback clock signal fbCLK and the clock signal CK are supplied to the phase determining circuit 222. The phase determining circuit 222 detects a phase difference between the clock signal CK and the feedback clock signal fbCLK. As mentioned above, the phase of the feedback clock signal fbCLK is adjusted by the delay line 210 so as to coincide with that of read data DQ. Both the phases change from moment to moment due to variations in parameters to affect the amount of delay of the delay line 210, such as voltage and temperature, and variations in the frequency of the external clock signal CK itself. The phase determining circuit 222 detects such changes, and determines whether the phase of the feedback clock signal fbCLK leads or lags behind that of the clock signal CK. The determination is made at every cycle of the clock signal CK, and the result is supplied to the counter control circuit 223 as a phase determining signal PD.

The counter control circuit 223 generates an up/down signal U/D based on the phase determining signal PD. The counter control circuit 223 updates the up/down signal U/D in synchronization with a sampling clock signal SYNCLK1. The sampling clock signal SYNCLK1 is generated by the frequency dividing circuit 225. The frequency dividing circuit 225 divides the clock signal CK in frequency to generate sampling clock signals SYNCLK1 and SYNCLK2 having frequencies lower than that of the clock signal CK (external synchronizing signal). Although not limited in particular, the frequency dividing number may be set to 16 or 32. For example, if the frequency dividing circuit 225 divides the clock signal CK by 16, the sampling clock signals SYNCLK1 and SYNCLK2 are activated at every 16 cycles of the clock signal CK. In such a case, the sampling period is 16 clock cycles.

The up/down signal U/D generated by the counter control circuit 223 is supplied to the counter circuit 224. The counter circuit 224 counts up or down based on the up/down signal U/D. The counter circuit 224 counts up or down in synchronization with the sampling clock signal SYNCLK2 which lags behind the sampling clock signal SYNCLK1 in phase. The count value COUNT of the counter circuit 224 is supplied to the delay line 210, whereby the amount of delay of the delay line 210 is determined.

The phase control circuit 220 thus configured has a first operation mode for changing the amount of delay of the delay line 210 in synchronization with the sampling clock signal SYNCLK2, and a second operation mode for fixing the amount of delay of the delay line 210. In other words, a phase control operation is performed on the clock signal LCLK for output in the first operation mode. The phase of the clock signal LCLK for output is fixed in the second operation mode.

Entering the second operation mode, the phase control circuit 220 consumes little power with the circuit blocks 221 to 225 suspended. In addition, the count value of the counter circuit 224 is not reset even in the second operation mode, and the count value at the time of entering the second operation mode is retained. That is, the delay line 210 is fixed to the amount of delay immediately before entering the second operation mode. The power supply to at least the counter circuit 224 therefore need to be maintained uninterrupted. The power supply to the other circuit blocks (the replica circuit 221, the phase determining circuit 222, the counter control circuit 223, and the frequency dividing circuit 225) may be interrupted when in the second operation mode. For the sake of quick transition (recovery) from the second operation mode to the first operation mode, however, it is preferred that the power supply be kept uninterrupted to maintain the state of performing no switching operation according to changes of the input signals, i.e., maintain the state of fixed logic.

The operation mode of the phase control circuit 220 is selected by the stop signal STOP which is supplied from the mode switching circuit 230. Specifically, the phase control circuit 220 is in the first operation mode when the stop signal STOP is in an inactive state (low level). The phase control circuit 220 enters the second operation mode when the stop signal STOP is in an active state (high level).

As shown in FIG. 8, the mode switching circuit 230 is supplied with the up/down signal U/D which output from the counter control circuit 223, and a refresh signal REFB output from the access control circuit 20 shown in FIG. 2. Based on the signals, the mode switching circuit 230 generates the stop signal STOP. As will be described in detail, the mode switching circuit 230 according to the present embodiment is composed of a dither determining circuit. The dither determining circuit monitors the pattern of change of the up/down signal U/D to detect a DLL lock. As employed herein, the "DLL lock" refers to a state where the clock signal CK and the feedback clock signal fbCLK generally coincide with each other in phase.

Figure 9:
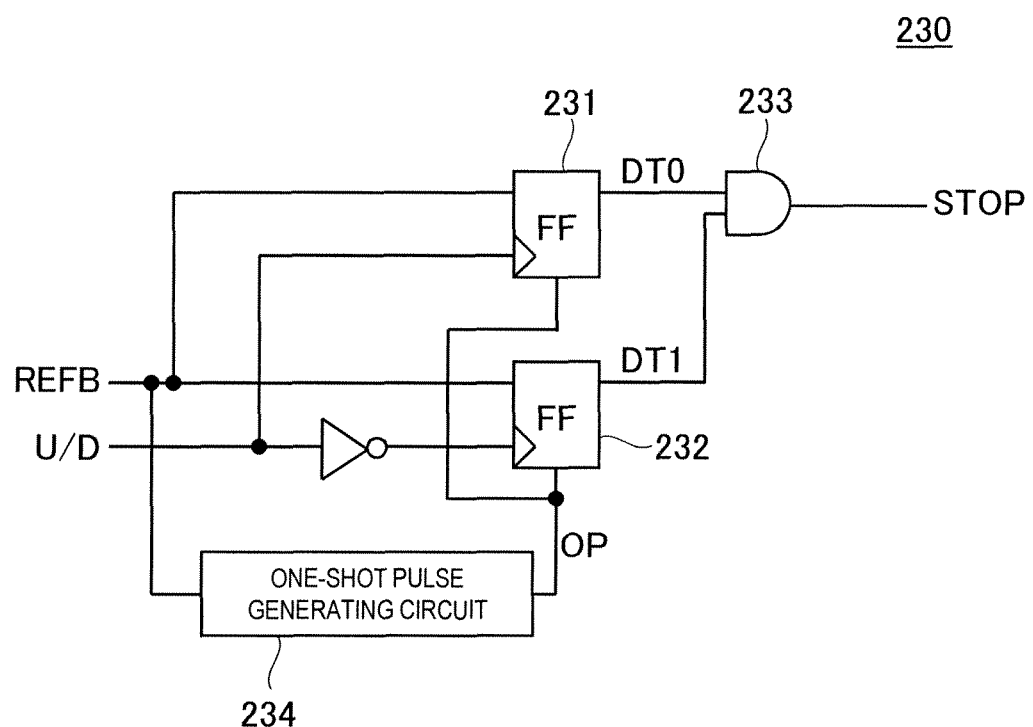
FIG. 9 is a circuit diagram of a mode switching circuit (dither determining circuit) 230 shown in FIG. 8.
Figure 10:
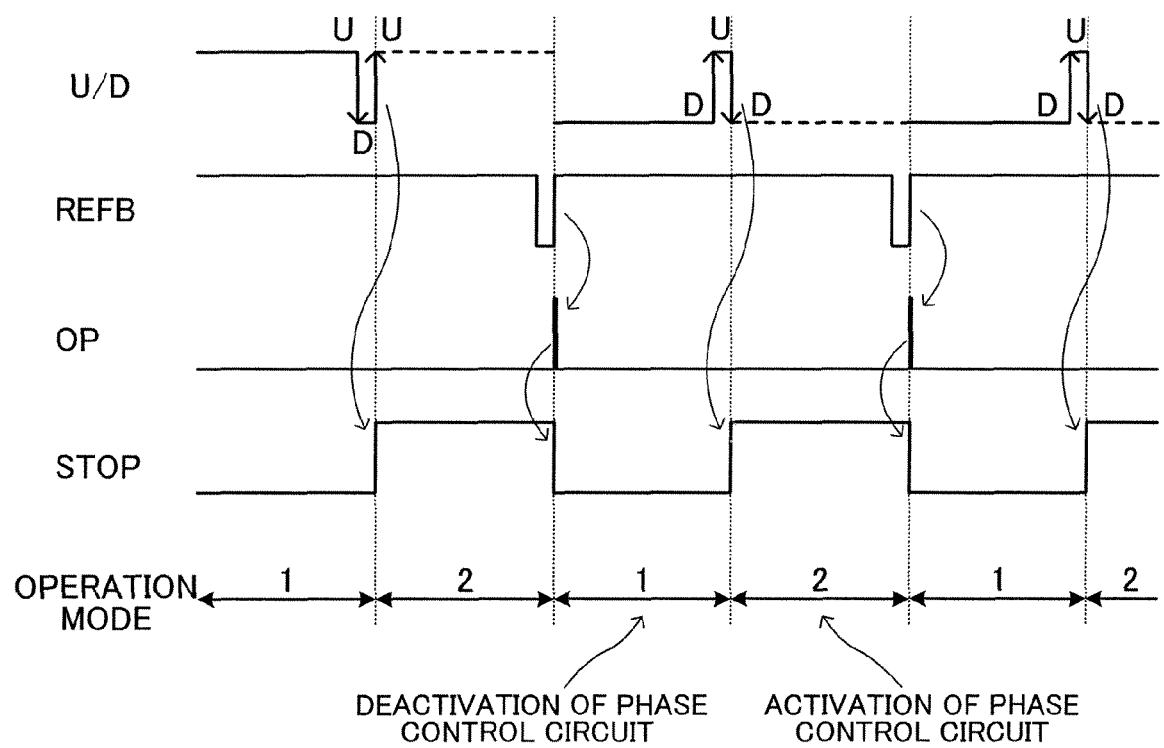
FIG. 10 is a timing chart for explaining an operation of a mode switching circuit 230 FIG. 8.

Turning to FIGS. 9 and 10, the mode switching circuit 230 shown in FIG. 9 according to the present embodiment includes latch circuits 231 and 232, an AND gate 233, and a one-shot pulse generating circuit 234. The latch circuits 231 and 232 latch the refresh signal REFB. The AND gate 233 is supplied with the output signals DT0 and DT1 of the latch circuits 231 and 232. The one-shot pulse generating circuit 234 generates a one-shot pulse OP based on the refresh signal REFB.

The refresh signal REFB is a low-active signal. In normal situations, the refresh signal REFB is fixed to a high level. When a refresh command is issued from outside, the access control circuit 20 changes the refresh signal REFB to a low level for predetermined time. When a refresh operation using the row decoder 12 and the sense circuit 14 shown in FIG. 2 is completed, the refresh signal REFB returns to a high level. Among refresh commands issued to the semiconductor device from outside is an auto refresh command.

When the refresh signal REFB is deactivated, i.e., changed from a low level to a high level, the one-shot pulse generating circuit 234 generates a one-shot pulse OP as shown in FIG. 10. The occurrence of the one-shot pulse OP resets the latch circuits 231 and 232, whereby both the output signals DT0 and DT1 are turned to a low level. Immediately after the completion of a refresh operation, the stop signal STOP, or the output signal of the AND gate 233, is therefore always at a low level. When the stop signal STOP is at a low level, the phase control circuit 220 selects the first operation mode as mentioned above. In other words, the phase control operation on the clock signal LCLK for output is performed in synchronization with the sampling clock signal SYNCLK2.

The up/down signal U/D is supplied to the clock input end of the latch circuit 231. The inverted up/down signal U/D is supplied to the clock input end of the latch circuit 232. When the up/down signal U/D makes a change, either one of the latch circuits 231 and 232 latches a high level. When the up/down signal U/D makes another change, the other of the latch circuits 231 and 232 latches a high level. That is, when the up/down signal U/D changes twice (i.e., when a DLL lock is detected by dither determination, indicating that a near zero phase difference is achieved by the phase adjusting operation), both the output signals DT0 and DT1 of the latch circuits 231 and 232 become high level. As a result, the stop signal STOP, or the output signal of the AND gate 233, changes to a high level. When the stop signal STOP is at a high level, the phase control circuit 220 selects the second operation mode as mentioned above. In other words, the phase of the clock signal LCLK for output is fixed. The foregoing is the dither process of the dither determining circuit. The up/down signal U/D may be referred to as a dither signal.

Examples of the cases where the up/down signal U/D changes twice include when the determination changes in order of up, down, and up (U/D/U), and when the determination changes in order of down, up, and down (D/U/D). Both the patterns can appear when the clock signal CK and the feedback clock signal fbCLK generally coincide with each other in phase. The patterns are characteristic to a DLL lock.

In consequence, as shown in FIG. 10, the operation mode changes from the first to the second each time a DLL lock is detected by dither determination. The operation mode changes from the second to the first each time the refresh signal REFB is activated. The intermittent execution of the phase control operation by a trigger signal (refresh signal REFB) reduces the power consumption of the phase control circuit 220.

Now, when the phase control circuit 220 enters the second operation mode to suspend the phase control operation, the clock signal LCLK for output may fail to properly follow the clock signal CK. In the present embodiment, however, the refresh signal REFB activated at high frequency is used as the trigger signal to restore the first operation mode. The suspension of the phase control operation therefore causes little shift in phase. Specifically, an auto refresh command is issued at a frequency of microsecond order. A significant shift in phase can hardly occur in such a short interval, and the output quality of read data will not drop due to the intermittent suspensions of the phase control operation. The output quality of read data may rather improve since the clock signal LCLK for output is free of jitter while the phase control operation is suspended.

Taking account of the activation of an auto refresh command at a predetermined frequency, the present embodiment utilizes an auto refresh command as the trigger signal for shifting from the second operation mode to the first operation mode. This eliminates the need to add a special circuit for shifting the phase control circuit 220 into the first operation mode.

Moreover, in the present embodiment, the stop signal STOP is supplied to the power supply circuit 100 shown in FIG. 2. Consequently, when the phase control circuit 220 is in the first operation mode, the pumping operations of all the internal voltage generating circuits 110 to 113 are stopped. This prevents the phase control operation of the phase control circuit 220 from being affected by noise that occurs from the pumping operations of the internal voltage generating circuits 110 to 113.

Next, a third embodiment of the present invention will be described.

In the third embodiment, the inverted signal of the stop signal STOP is supplied to the gate electrode of the inverter 151 shown in FIG. 3 instead of the read state signal STATE. When the phase control circuit 220 is activated, the internal voltage generating circuits 112 and 113 are thereby disabled independent of the comparison circuit 140. When the phase control circuit 220 is not activated, the internal voltage generating circuits 112 and 113 operate according to the comparison circuit 140.

Next, a fourth embodiment of the present invention will be described.

In the fourth embodiment, the stop signal STOP is supplied to a third gate electrode of the NAND gate circuit 152 in FIG. 3 instead of the read state signal STATE. When in a read period and when the phase control circuit 220 is activated, the internal voltage generating circuits 112 and 113 are thereby disabled independent of the comparison circuit 140. When not in a read operation and when the phase control circuit 220 is not activated, the internal voltage generating circuits 112 and 113 operate according to the comparison circuit 140.

It is apparent that the present invention is not limited to the above embodiments, but may be modified and changed without departing from the scope and spirit of the invention.

The technical concept of the present invention is applicable to internal voltage generating circuits that generate positive or negative voltages. Whether or not to involve a pumping operation is not limited in particular. The forms of the circuits in the circuit blocks disclosed in the drawings and other circuits for generating the control signals are not limited to the circuit forms disclosed in the embodiments.

The technical concept of the semiconductor device according to the present invention may be applied to volatile memories such as SRAM and nonvolatile memories, and even various types of semiconductor devices other than memories. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following devices:

A1. A semiconductor device comprising:
a plurality of internal voltage generating circuits each supplying a first voltage to a first power supply line;
a first load circuit that operates on the first voltage supplied from the first power supply line;
a plurality of second load circuits that operate on a second voltage supplied from a second power supply line, the second load circuits including a third load circuit;
a comparison circuit that compares a potential of the first voltage with a reference voltage; and
a control circuit that controls the first load circuit, the plurality of second load circuits, and the plurality of internal voltage generating circuits, wherein
the control circuit generates a control signal and supplies the control signal to the plurality of internal voltage generating circuits,
the control signal indicates a first operation state when the first load circuit is in an active state and the third load circuit is in an inactive state,
the control signal indicates a second operation state when both the first and third load circuits are in the active state,
all the plurality of internal voltage generating circuits are activated in response to a comparison result of the comparison circuit when the control signal indicates the first operation state, and
a part of the plurality of internal voltage generating circuits is activated and a remaining internal voltage generating circuit is deactivated in response to the comparison result of the comparison circuit when the control signal indicates the second operation state.

A2. The semiconductor device according to A1, wherein
the third load circuit includes a data output circuit that outputs data read from a memory cell array,
the data output circuit is deactivated in the first operation state, and
the data output circuit is activated in the second operation state.

A3. The semiconductor device according to A2, wherein
the data output circuit includes a fourth load circuit and a fifth load circuit,
the first and fourth load circuits are activated and the fifth load circuit is deactivated so as to be brought into the first operation state when a refresh command is issued, and
the first, fourth, and fifth load circuits are activated so as to be brought into the second operation state when an active command and a read command are issued.

A4. The semiconductor device according to A1, wherein
the third load circuit includes a phase comparison circuit that compares a phase of an external clock signal with that of an internal clock signal, the external clock signal being supplied from outside the semiconductor device, the phase comparison circuit is deactivated in the first operation state, and
the phase comparison circuit is activated in the second operation state.

A5. The semiconductor device according to A4, further comprising a DLL circuit that includes the phase comparison circuit, a delay circuit, and a phase control circuit, the delay circuit generating the internal clock signal by delaying the external clock signal, the phase control circuit controlling a delay amount of the delay circuit based on the comparison result of the phase comparison circuit, wherein
the delay circuit is activated and the phase comparison circuit is deactivated in the first operation state, and
the delay circuit and the phase comparison circuit are activated in the second operation state.

A6. The semiconductor device according to A1, further comprising an oscillation circuit controlled by an output signal of the comparison circuit to generate an oscillator signal, wherein
each of the plurality of internal voltage generating circuits includes a charge pump circuit having a capacitor, each charge pump circuit performing a pumping operation to the capacitor in response to the oscillator signal supplied from the oscillation circuit, and
the control circuit includes a logic circuit having input nodes to which the control signal and the oscillator signal are supplied, respectively, and having an output node connected to the remaining internal voltage generating circuit.

What is claimed is:

1. A device comprising:
    first and second power supply lines;
    a plurality of internal voltage generating circuits each supplying a first voltage to the first power supply line;
    a comparison circuit comparing the first voltage with a reference voltage to generate a comparison signal, the comparison signal indicating a first logic level when the first voltage is lower than the reference voltage and indicating a second logic level when the first voltage is higher than the reference voltage;
    a first load circuit operating on the first voltage;
    a second load circuit operating on a second voltage supplied from the second power supply line; and
    a control circuit generating a control signal, the control signal indicating a third logic level when the second load circuit is in an active state and indicating a fourth logic level when the second load circuit is in an inactive state, wherein
    the internal voltage generating circuits include at least first and second internal voltage generating circuits,
    the first internal voltage generating circuit is activated when the comparison signal indicates the first logic level and the control signal indicates the fourth logic level, and deactivated when the comparison signal indicates the first logic level and the control signal indicates the third logic level or when the comparison signal indicates the second logic level, and
    the second internal voltage generating circuit is activated regardless of a logic level of the control signal when the comparison signal indicates the first logic level, and deactivated when the comparison signal indicates the second logic level.

2. The device as claimed in claim 1, wherein the second load circuit includes a data output circuit that outputs data read from a memory cell array.

3. The device as claimed in claim 2, wherein
the data output circuit includes third and fourth load circuits,
the control circuit activates the first and third load circuits and deactivates the fourth load circuit when a refresh command is issued, and
the control circuit activates the first, third, and fourth load circuits when an active command and a read command are issued.

4. The device as claimed in claim 1, wherein the second load circuit includes a phase comparison circuit that compares a phase of an external clock signal with that of an internal clock signal, the external clock signal being supplied from outside the semiconductor device.

5. The device as claimed in claim 4, wherein
the second load circuit includes a DLL circuit that includes the phase comparison circuit, a delay circuit, and a phase control circuit, the delay circuit delaying the external clock signal to generate the internal clock signal, the phase control circuit controlling a delay amount of the delay circuit based on a comparison result of the phase comparison circuit,
the third logic level of the control signal indicates a state where the delay circuit is in an active state and the phase comparison circuit is in an inactive state, and
the fourth logic level of the control signal indicates a state where both the delay circuit and the phase comparison circuit are in the active state.

6. The device as claimed in claim 1, further comprising an oscillation circuit controlled by the comparison signal to generate an oscillator signal, wherein
each of the internal voltage generating circuits includes a charge pump circuit having a capacitor, each charge pump circuit performing a pumping operation to the capacitor in response to the oscillator signal, and
the control circuit includes a logic circuit having input nodes to which the control signal and the oscillator signal are supplied, respectively, and having an output node connected to the second internal voltage generating circuit.

7. The device as claimed in claim 1, wherein the first load circuit includes a word driver that drives word lines.

8. The device as claimed in claim 1, wherein
a plurality of the first internal voltage generating circuits operating in different phases from each other are provided, and
a plurality of the second internal voltage generating circuits operating in different phases from each other are provided.

9. The device as claimed in claim 8, wherein the plurality of first internal voltage generating circuits and the plurality of second internal voltage generating circuits operate in different phases from one another.

10. The device as claimed in claim 1, wherein the internal voltage generating circuits further include a third internal voltage generating circuit that is activated regardless of the comparison signal and the control signal.

11. The device as claimed in claim 1, wherein the first voltage is higher than the second voltage.

12. The device as claimed in claim 11, further comprising a step-down circuit that steps down an external power supply voltage supplied from outside the device to generate the second voltage and supplies the second voltage to the second power supply line,
wherein the internal voltage generating circuits boost the external power supply voltage to generate the first voltage and supply the first voltage to the first power supply line.

13. A device comprising:
a terminal;
a first voltage generator generating, when activated, a voltage at the terminal and stopping, when deactivated, generating the voltage, the first voltage generator being configured to be activated in response to a first control signal taking an active level and deactivated in response to the first control signal taking an inactive level; and
a second voltage generator generating, when activated, the voltage at the terminal and stopping, when deactivated, generating the voltage, the second voltage generator being configured to be activated in response to each of the first control signal and a second control signal taking an active level and deactivated in response to at least one of the first and second control signal taking an inactive level.

14. The device as claimed in claim 13, wherein the first voltage generator generates the voltage in response to a first oscillation signal and the second voltage generator generates the voltage in response to a second oscillation signal, the first oscillation signal being controlled in response to the first control signal, the second oscillation signal being controlled in response to the first and second control signals.

15. The device as claimed in claim 14, further comprising an oscillation circuit that produces the first oscillation signal in response to the first control signal taking the active level and the second oscillation signal in response to each of the first and second control signals taking the active level.

16. The device as claimed in claim 15, wherein the oscillation circuit comprises an oscillator that oscillates in response to the active level of the first control signal to produce the first oscillation signal, the oscillation circuit further comprising a gate circuit that is coupled to the oscillator to produce the second oscillation signal in response to the second control signal taking the active level and the oscillator oscillating.

17. The device as claimed in claim 13, further comprising a comparator comparing the voltage with a reference potential to control a level of the first control signal.

18. The device as claimed in claim 17, further comprising a first load circuit coupled to the terminal to operate on the voltage and a second load circuit operating a different voltage than the voltage, the second control signal taking the inactive level in response to the second load circuit operating.

19. The device as claimed in claim 13, further comprising a comparator comparing the voltage with a reference potential to produce a third control signal and a gate circuit controlling the first control signal to the inactive level in response to at least one of the third control signal and a fourth control signal taking an inactive level.

20. The device as claimed in claim 19, wherein the fourth control signal takes the inactive level when each of the first and second voltage generators is deactivated irrespective of an active level of the third control signal.

* * * * *